United States Patent [19]

Zachry

[11] Patent Number: 4,554,505

[45] Date of Patent: Nov. 19, 1985

[54] TEST SOCKET FOR A LEADLESS CHIP CARRIER

[75] Inventor: Clyde L. Zachry, Camarillo, Calif.

[73] Assignee: Rockwell International Corporation, El Segundo, Calif.

[21] Appl. No.: 503,002

[22] Filed: Jun. 10, 1983

[51] Int. Cl.[4] ................ G01R 31/02; H01R 39/00
[52] U.S. Cl. .................... 324/158 F; 339/17 CF
[58] Field of Search ............... 324/158 F, 158 P; 339/17 CF, 75 MP, 176 MF

[56] References Cited

U.S. PATENT DOCUMENTS 3,911,361 10/1975 Bove et al. ............... 324/158 P
4,018,491 4/1977 Niedzwiecke et al. ....... 339/17 CF Primary Examiner—Ernest F. Karlsen
Attorney, Agent, or Firm—H. Fredrick Hamann; Craig O. Malin

[57] ABSTRACT

A socket is provided for testing leadless chip carriers. The socket has a base with a resilient pad. A planar assembly of coaxial cables is positioned above the base so that a terminal contact of each cable is located on the resilient pad in alignment with the contacts on the chip carrier. A frame is coupled to the planar assembly of coaxial cables and to the base. The frame has an opening for receiving and aligning the contacts of the carrier with the contacts of each coaxial cable. The socket has a cover which is hinged and latched to the base. A screw threaded through the cover is used to apply pressure to the carrier in the socket.

6 Claims, 4 Drawing Figures

TEST SOCKET FOR A LEADLESS CHIP CARRIER

The Government has rights in this invention pursuant to contract Number MDA 903-82-C-0175 awarded by the Department of the Army.

BACKGROUND OF THE INVENTION

This invention relates to the field of integrated circuits and particularly to fixtures for testing high frequency devices.

In the testing of high frequency chip carriers, the efficient transmission of energy from the chip carrier to the measuring instruments is an important design requirement which calls for precise electrical matching of all components. The aim is to produce precise impedance matching at smooth, lossless transitions when waveguides are coupled to the chip carrier being tested and to instruments and other devices in the test set up. Microwave transmission is extremely sensitive to surface discontinuities which cause power losses and induce unwanted reflections. These inefficiencies particularly show up when surfaces join or abut each other. These losses, in addition to reflection losses due to impedance mismatch, are insertion losses and are present at any junction.

Leadless chip carriers have metal pads which are designed to be bonded directly into circuits without the use of leads, hence they are termed "leadless". To test these chip carriers, a socket is needed to hold the carriers and to contact each of their metal pads. Conventional leadless chip carrier sockets use separate metal springs which contact the metal pads on the carrier when it is inserted into the socket. These spring contacts introduce insertion losses and impedance mismatch, and there is a continuing need to provide convenient test sockets which minimizes such inefficiencies.

SUMMARY OF THE INVENTION

It is an object of the invention to provide an improved leadless chip carrier test socket.

It is an object of the invention to provide a leadless chip carrier test socket which provides for the efficient transfer of high frequency energy between the leadless chip carrier and the external test circuit.

It is an object of the invention to provide a leadless chip carrier connector which has reduced power loss, reflection, and impedance mismatch.

According to the invention, a socket is provided which does not use metal springs to contact the metal pads on the chip carrier. Rather, the carrier's metal pads are pressed directly against the contacts of an assembly of flat coaxial cables.

The socket has a base with a resilient pad. A planar assembly of flat coaxial cables is positioned above the base so that the terminal contacts of each cable is located on the resilient pad around its circumference, matching the geometry of the contacts on the carrier. A frame having an opening for the carrier is aligned over the planar assembly of coaxial cables and held against it by screws which go through alignment holes in the frame and into the base of the socket.

The socket has a cover which is hinged and latched to the base. A screw threaded through the cover bears against the carrier being held in the socket and presses the carrier against the contacts of the coaxial cables. The resilient pad under the contacts provides for any thickness mismatch which may exist between the metal pads on the carrier and the contacts of the coaxial cables. In addition to pressing the carrier, the screw also provides a good path for the conduction of heat from the chip carrier to outside the socket.

These and other objects and features of the invention will be apparent from the following detailed description taken with reference to the accompanying drawings.

DESCRIPTION OF THE PREFERRED EMBODIMENT

Figures 1, 2:
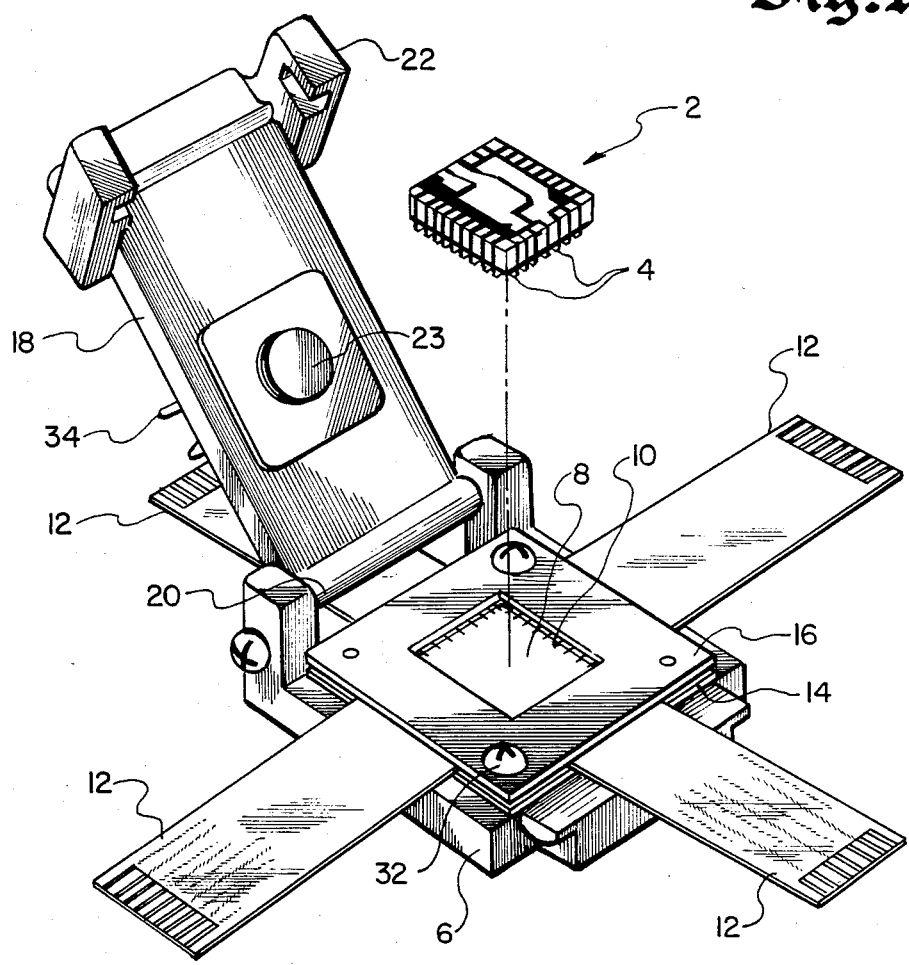
FIG. 1 is a perspective view of the socket with its cover open.
FIG. 2 is a perspective view of a closed socket with a partial cutout showing the leadless chip carrier installed in the socket.
Figure 3:
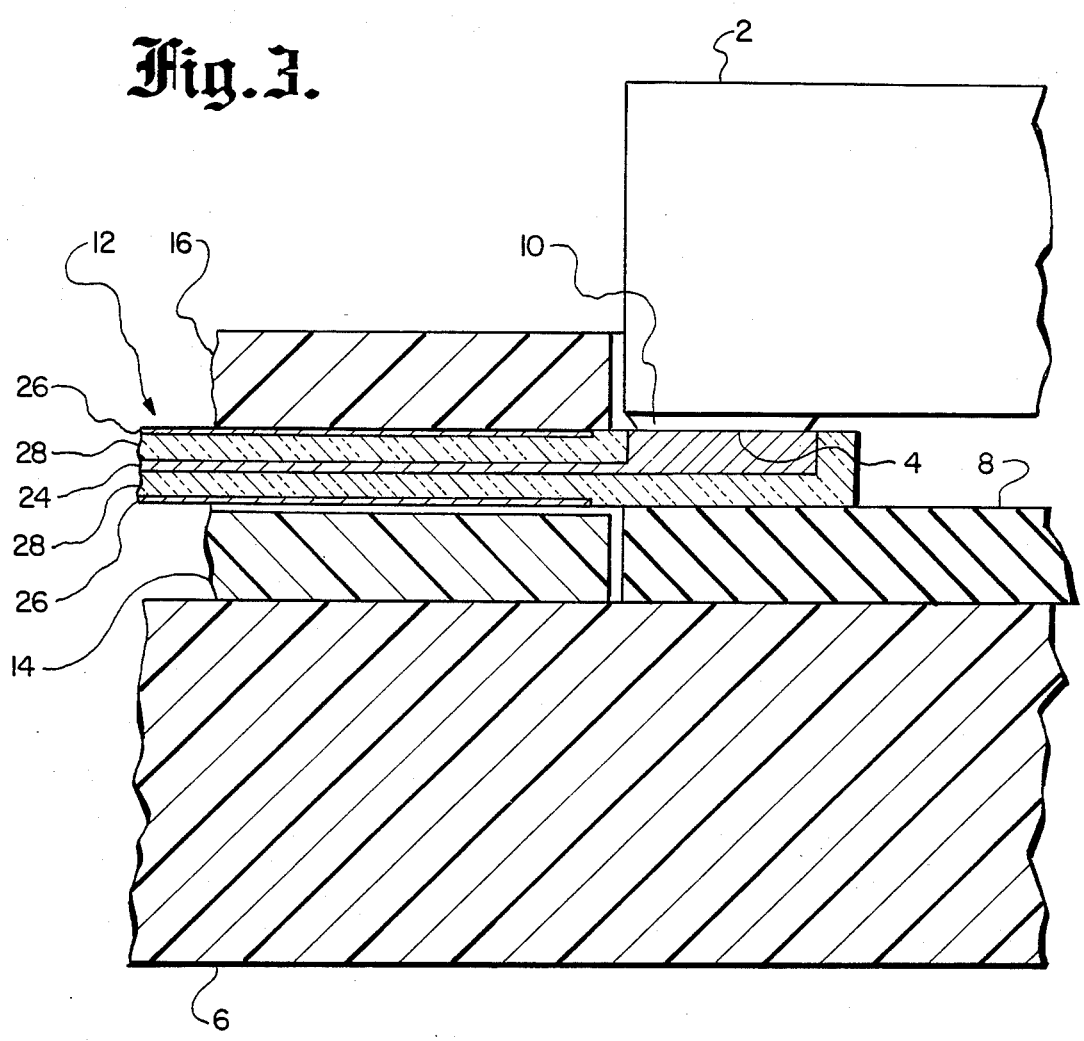
FIG. 3 is a partial cross section showing engagement of the chip carrier contacts with the cable contacts.
Figure 4:
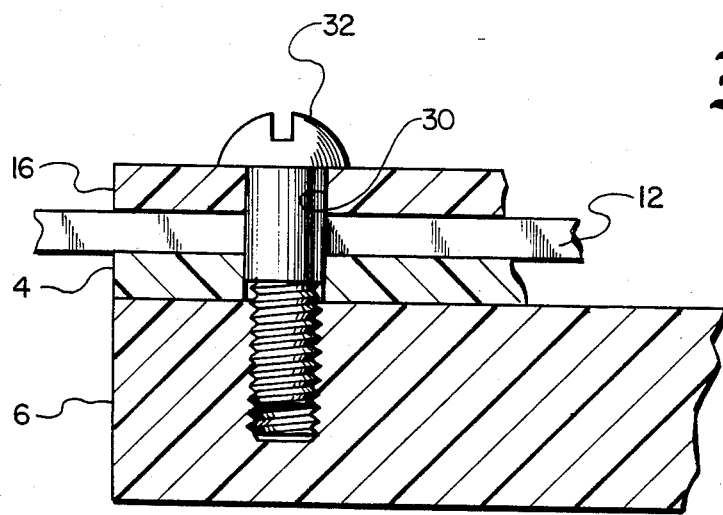
FIG. 4 is a partial cross section showing the assembly of the alignment screw.

FIG. 1 shows the socket of the invention in an open position ready to receive a typical leadless chip carrier 2. The chip carrier has small metal bumps or contacts 4 which are bonded to the circuit in which the chip carrier is used. However, for testing, the socket is used to press contacts 4 against the mating contacts in the test circuit without bonding.

The socket has a base 6 with a resilient pad 8 that covers the area under contacts 10 in a planar assembly of flat coaxial cables 12. Contacts 10 are positioned to match the contacts 4 in chip carrier 2. As shown in FIG. 1, the planar assembly of coaxial cables 12 has four sections which are joined together in the socket between lower frame 14 and upper frame 16. Each cable section has contacts on both ends which are joined together by shielded conductors running through the center of the cable. Of course, other arrangements of cable sections are within the scope of the invention.

The socket has a cover 18 which is connected to base 6 by a hinge 20. A latch 22 is provided to hold cover 18 against base 6 when the socket is in the closed position. FIG. 1 also shows the underside of metal screw 23 which extends through a threaded hole in cover 18 and bears against chip carrier 2 when the cover is closed.

FIG. 2 shows the socket in the closed position with chip carrier 2 installed within upper frame 16 so that its contacts 4 are pressed against mating contacts 10 of the coaxial cables. Each coaxial cable in the planar assembly has a central conductor 24 extending from contact 10, and is separated from metal shield 26 by dielectric 28. The ends of cable 12 having contacts 10 are positioned over resilient pad 8. This is a rubber pad which has enough resiliency to provide for some mismatch in the thickness of mating contacts 10, 4. When pressure is applied to chip carrier 2 by screw 23 the contact ends of the cables are pressed into pad 8 a sufficient distance to avoid gaps between mating contacts 10, 4 which might otherwise result due to small variations in thickness.

Two alignment holes 30 extend through upper and lower frames 16, 14, and into base 6. Screws 32 extend through holes 30 to hold the frames 14, 16, and coaxial cables 12, and to align them over resilient pad 8 on the base. Upper frame 16 extends around chip carrier 2 and thus positions it so that its contacts 4 will be in alignment with contacts 10 of coaxial cables 12.

Latch 22 closes against a knob in base 6 and holds cover 18 in the closed position. Screw 23 is adjusted so that it bears against the top of chip carrier 2 with sufficient pressure to provide good contact between the chip carrier and the contacts of the coaxial cables. Cooling fins 34 have been provided on screw 23 to help dissipate the heat which flows from the chip carrier through screw 23. Screw 23 has a large base to provide uniform pressure and good heat conduction from chip carrier 2. It is made from a metal having good thermal conductivity and thus helps cool chip carrier 2 during testing.

Numerous variations and modifications can be made without departing from the invention. For example, a coil or a leaf spring can be provided under the cover to provide pressure against the chip carrier rather than by the use of a screw. Alignment pins or even abutting surfaces can be used rather than screws to align the base, frame, and planar assembly of flat coaxial cables. The frame can be bonded onto, or molded as an internal part of, the planar assembly and base. The resilient pad can be embedded substantially flush with the top surface of the base so that a lower frame is not needed. Accordingly, it should be understood that the form of the invention described above is illustrative only and is not intended to limit the scope of the invention.

What is claimed is:

1. A test socket for a high frequency leadless chip carrier, comprising:
    a base;
    a cover coupled to and spaced from said base;
    a frame coupled to said base, said frame having an opening to receive and position the chip carrier;
    a planar assembly of coaxial cables having contacts at one end, said planar assembly being coupled to said frame;
    a resilient pad supported by said base within said opening and positioned under said coaxial cable contacts in line with the corresponding contacts of the chip carrier so that said coaxial cable contacts can be compressed against the corresponding contacts of the chip carrier in a planar manner; and
    means connected to said cover for compressing the contacts of the leadless chip carrier against said contacts of said coaxial cables.

2. The socket as claimed in claim 1 including:
    two alignment holes in said frame;
    two threaded alignment holes in said base corresponding to said alignment holes in said frame; and
    screws extending through said alignment holes and into said threaded holes in said base.

3. The socket as claimed in claim 1, wherein said means for compressing the contacts comprises a threaded hole in said cover and a screw extending through said threaded hole in a position to bear against the top of said chip carrier.

4. The socket as claimed in claim 1, wherein said means for compressing comprises a spring under said cover.

5. The socket as claimed in claim 1, including a hinge coupling one end of said cover to said base and a latch coupling the other end of said cover to said base.

6. A socket for a high frequency leadless chip carrier comprising:
    a base;
    a cover having a hinge and a latch for coupling said cover to said base;
    means connected to said cover for applying pressure to the chip carrier when it is positioned in the socket;
    a frame coupled to said base, said frame having an opening to receive and position the chip carrier;
    a planar assembly of coaxial cables having contacts extending out from one end, said assembly being coupled to said frame; and
    a resilient pad supported by said base within said opening and positioned under said coaxial cable contacts in line with the corresponding contacts of the chip carrier, so that said coaxial cable contacts can be compressed against the corresponding contacts of the chip carrier in a planar manner by said means for applying pressure.

* * * * *